United States Patent [19]

Tosswill

[11] Patent Number: 4,701,618

[45] Date of Patent: Oct. 20, 1987

[54] MIDDLE-INFRARED IMAGING DEVICE

[75] Inventor: Christopher H. Tosswill, Sturbridge, Mass.

[73] Assignee: Galileo Electro-Optics Corp., Sturbridge, Mass.

[21] Appl. No.: 738,353

[22] Filed: May 28, 1985

[51] Int. Cl.$^4$ .............................................. H01L 31/14

[52] U.S. Cl. .................................... 250/330; 250/332; 250/370

[58] Field of Search ................. 250/330, 331, 338 PY, 250/338 SE, 332, 370 G

[56] References Cited

U.S. PATENT DOCUMENTS 3,130,309 4/1964 Snyder ............................... 250/330

3,983,395 9/1976 Kim ............................. 250/338 SE 4,080,532 3/1978 Hopper .............................. 250/330

4,147,932 4/1979 Lewis ................................. 250/331

4,316,103 2/1982 Nathanson ......................... 250/332

FOREIGN PATENT DOCUMENTS 2752704 6/1978 Fed. Rep. of Germany ...... 250/330

*Primary Examiner*—Janice A. Howell

*Assistant Examiner*—David P. Porta

[57] ABSTRACT

A middle-infrared image intensifier including an image-forming microchannel plate, a thermionic emissive membrane in front of the microchannel plate, and a lens system to form a middle-infrared image on the membrane, whereby electrons emitted from the membrane are multiplied in channels of the microchannel plate.

12 Claims, 6 Drawing Figures

MIDDLE-INFRARED IMAGING DEVICE

FIELD OF THE INVENTION

The invention relates to middle-infrared image intensifiers.

BACKGROUND OF THE INVENTION

Present direct-view, night-vision, image intensifiers employ photoelectron emission for the primary photodetection process, and thus are limited to visible, near-infrared wavelengths not greater than one micron, e.g., provided by moonlight or starlight, in order to obtain the energy necessary for photoelectron emission. In these devices microchannel plates are typically used to amplify the electrons, which are then directed to a phosphor screen, to provide a visible image.

Imaging systems for middle-infrared radiation (i.e., resulting from heat), which has insufficient energy for photoelectron emission, are indirect, employing arrays of semicondcutor elements connected to display devices by pluralities of wires. These systems are thus complicated, large, heavy, and expensive.

SUMMARY OF THE INVENTION

I have discovered that middle-infrared image intensification can be achieved at room temperature and without the need for a cooling system by using a lens to form a middle-infrared image on a thermionic emissive membrane and multiplying the electrons emitted from the back of the membrane in response to middle-infrared radiation on the front of the membrane in channels of a microchannel plate.

In preferred embodiments the electron flux from the microchannel plate is directed to an electroluminescent display to provide a visible image; and a modulator is used to repetitively admit and block incoming middle-infrared radiation, and an image extraction stage is used to provide signals related to the difference between the electron flux from the microchannel plate when the incoming middle-infrared radiation is admitted and the electron flux when the incoming middle-infrared radiation is blocked.

Other advantages and features of the invention will be apparent from the claims and from the following description of the preferred embodiments.

DESCRIPTION OF THE PREFERRED EMBODIMENTS

The drawings are briefly described first.

DRAWINGS

STRUCTURE

Figure 1:
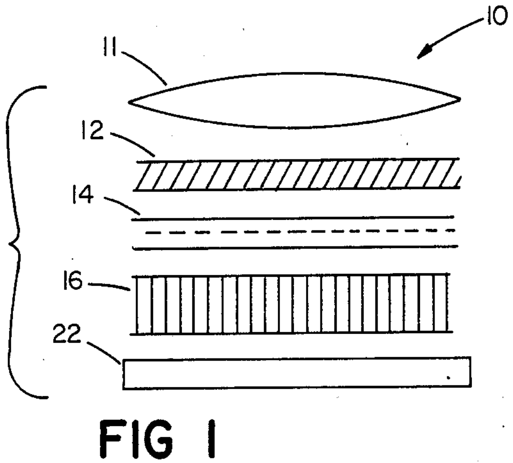
FIG. 1 is a diagrammatic vertical sectional view of a middle-infrared image intensifier according to the invention.
Figure 1A:
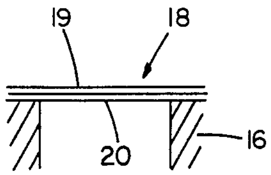
FIG. 1A is an enlarged view of a portion of FIG. 1.

Referring to FIGS. 1 and 1A, there is shown middle-infrared (middle-IR) image intensifier 10 including middle-IR transparent lens system 11, middle-IR transparent window 12, middle-IR image modulator 14 (a Pockels cell, which transmits radiation for a period of $T_d$ and blocks radiation for an equal period during each cycle), microchannel plate 16 (having conductive channels spaced 50–100 microns center-to-center, a maximum gain of $10^4$ and a maximum output of $10^8$ (electrons/channel-second), membrane 18 supported on the front of microchannel plate 16 and including silicon dioxide support layer 19 and cathode 20 (Cs-O-Ag material, Sl code, having a low work function of approximately 1.2 eV), and image extraction stage 22. Components 12 through 22 are contained within a vacuum seal formed between components 12 and 22.

Membrane 18 is between 100 angstroms and 10 microns thick, preferably about 1 and 10 microns; it should not be so thin that radiation passes through it without absorption, and it should not be so thick that there is a temperature gradient across it, owing to cooling at the periphery. It exhibits substantial thermionic emission at only moderately elevated temperatures and has sufficient electrical conductivity to replace electron emission losses without the creation of a perturbing lateral electric field.

Figure 2:
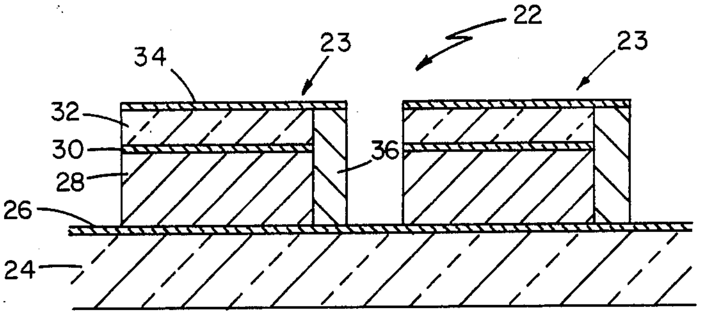
FIG. 2 is a diagrammatic vertical sectional view of an image extraction stage of the FIG. 1 apparatus according to the invention.

Referring to FIG. 2, the first embodiment of image extracting stage 22 includes glass output window 24 carrying layer 26 of vacuum deposited, transparent, electrically conductive tin oxide thereon. Supported across the surface of tin oxide layer 26 are units 23, each approximately 80 microns wide, spaced from each other by 100 microns center-to-center, generally square in plan view and arranged in rows and columns on glass window 24. Each unit 23 includes electroluminescent layer 28 (e.g., a member of the zinc sulfide family of electroluminescent material and between 10 and 100 microns thick) electrically conductive, metallic layer 30 (e.g., of a nickel-chrome alloy available under the trade designation Inconel) thereabove, 1–10 micron thick glass layer 32 thereabove, electrically conductive, metallic collector layer 34 thereabove, and resistor material 36 adjacent to layers 28 through 32 and underneath collector layer 34.

Figure 3:
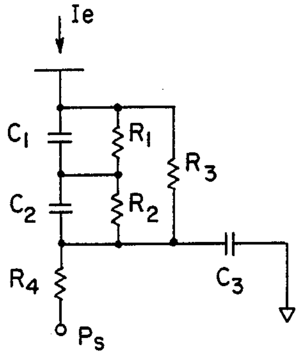
FIG. 3 is the equivalent circuit for a unit of the FIG. 2 image extraction stage.

Referring to FIG. 3 which is the equivalent circuit for a single unit 23, $I_e$ represents the electron flux hitting collector layer 34. Resistor $R_1$ is provided by glass layer 32, and capacitor $C_1$ is provided by glass layer 32 and conductive layers 30, 34 on opposite sides of it. Resistor $R_2$ is provided by zinc sulfide layer 28, and capacitor $C_2$ is provided by zinc sulfide layer 28 and overlapping portions of conductive layers 26, 30 on opposite sides of it. Bypass resistor $R_3$ is provided by material 36. Capacitor $C_3$ is outside of the sealed components of intensifier 10 and is connected to tin oxide layer 26. Power supply $P_s$ is also connected to tin oxide layer 26 through external resistor $R_4$. The materials and dimensions of components in each unit 23 are selected to provide certain electrical characteristics. The resistance of resistor $R_1$ is much greater than the resistance of resistor $R_2$; to achieve this glass layer 32 is designed to have as little leakage current as possible. The capacitance of capacitor $C_1$ is much greater than the capacitance of capacitor $C_2$, and the capacitance of capacitor $C_3$ is much greater than the capacitance of capacitor $C_2$, so that the ratio $1:(1+C_2/C_3+C_2/C_1)$, which determines the fraction of the modulated component of the electron flux that is applied to electroluminescent layer 28, is as high as possible. The product of the capacitance of capacitor $C_2$ times the resistance of $R_2$ is much greater than the value of $1/w_m$, where $w_m/2\pi$ is the input radiation modulation frequency of modulator 14. The actual values are as follows:

$C_1$: $10^{-13}$F
$C_2$: $10^{-14}$F
$R_1$: $10^{15}$ ohms
$R_2$: $10^{13}$ ohms
$R_3$: $5\times10^{12}$ ohms This makes the relaxation time-constant of electroluminescent layer 28 long compared to the radiation modulation period, to minimize resistive losses from the modulated signal. The maximum dielectric strength required of the capacitors is $10^5$ V/cm.

Figure 4:
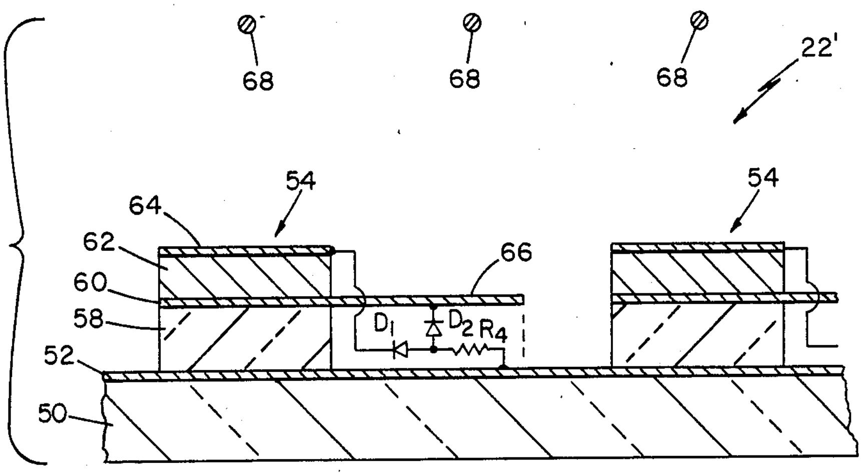
FIG. 4 is a diagrammatic, partially schematic, vertical sectional view of an alternative image extraction stage according to the invention.

Referring to FIG. 4, there is shown a partially schematic, vertical sectional view of a second embodiment of image extraction stage 22, this one designated 22'. It includes lower glass output window 50, on which is deposited transparent, electrically conductive tin oxide layer 52. Thereabove are supported units 54, each approximately 80 microns wide, spaced from adjacent units by about 100 microns center-to-center, generally square in shape in plan view, and arranged in rows and columns on glass window 50. Each unit 54 includes glass layer 58, electrically conductive metallic layer 60 thereabove, electroluminescent layer 62 thereabove, and electrically conductive collector layer 64 on top. Adjacent to layers 58-64 are electrically conductive collector layer 66 and diodes $D_1$, $D_2$ and resistor $R_4$, positioned below layer 66 and indicated schematically in FIG. 4. Suspended between 100 microns and 1 mm above, and aligned with, collector layers 64, 66 are tungsten wires 68 about 10 microns in diameter.

Figure 5:
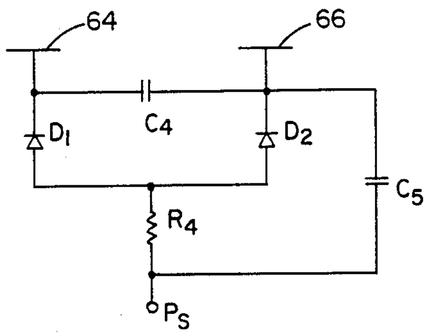
FIG. 5 is the equivalent circuit for a unit of the FIG. 4 image extraction stage.

Referring to FIG. 5, the equivalent circuit for a unit 54 is shown. Capacitor $C_4$ is provided by electroluminescent layer 62 and conductive layers 60, 64 on opposite sides of it. Capacitor $C_5$ is provided predominantly by glass layer 58 and overlapping portions of conductive layers 52, 60 on opposite sides of it and also by overlapping portions of conductive layers 52, 66 and the components between them. The materials and dimensions of the components are such that the resistance of resistor $R_4$ is between $10^{12}$ and $10^{13}$ ohms, preferably $10^{13}$ ohms and the capacitance of capacitor $C_5$ is between $10^{-14}$ and $10^{-15}$ farads, also the capacitance of capacitor $C_5$ is at least 10 times larger than the capacitance of capacitor $C_4$, and the maximum dielectric strength of the capacitors is $10^5$ V/cm.

OPERATION

In operation middle-IR radiation is projected by lens system 11 to form a middle-IR image on the front of membrane 18, heating up portions of the membrane to varying extents. Modulator 14 repetitively admits incoming middle-IR for a period $T_d$ and blocks incoming middle-IR for a period $T_d$, at a frequency of 100 Hz. Electrons are emitted from the rear of membrane 18 in an amount related to the temperature of the membrane at the positions from which they are emitted, and enter the various channels of microchannel plate 16. The electrons are multiplied within the channels of microchannel plate 16. The electron flux from microchannel plate 16 is directed to image extraction stage 22, where the electron flux resulting from background thermionic emission (i.e., that not due to the image formed on membrane 18) is subtracted from the total flux, and the visible image that is displayed by stage 22 is based upon the difference.

Image extraction stage 22, shown in detail in FIGS. 2 and 3, can be used when the thermionic emission based upon the middle-IR image is comparable in magnitude to the background emission of membrane 18 at room temperature. Image extraction stage 22', shown in detail in FIGS. 4 and 5, can be used when the thermionic emission based upon the middle-IR image is much smaller than the background emission of membrane 18 at room temperature..

In operation of the FIGS. 2-3 image extraction stage, because the resistance of resistor $R_1$ is very large, essentialy all of the DC component of the microchannel plate electron flux Ipasses through bypass resistor $R_3$, and only the AC component of the electron flux, based upon the middle-IR image on membrane 18, is directed to electroluminescent layer 28, and provides a visible image of the middle-IR radiation image on membrane 18.

In operation of the FIGS. 4-5 image extraction stage, wires 68 associated with collector layers 64 and wires 68 associated with collector layers 66 are alternately switched between positive and negative voltages in synchronization with the admission and rejection of middle-IR by modulator 14. When middle-IR radiation is admitted by modulator 14, the electrons from microchannel plate 16 are all deflected to collector layers 64 by providing a positive voltage on the wires in front of collector layers 64 and a negative voltage on the wires in front of collector layers 66. When middle-IR radiation is rejected by modulator 14, the electrons from microchannel plate 16 are all directed to collector layers 66, by providing a negative voltage on the wires in front of collector layers 64 and a positive voltage on the wires in front of collector layers 66.

If no middle-IR radiation is projected onto membrane 18, the electron fluxes hitting collector layers 64, 66 are the same; the potentials at collector layers 64, 66 are equal, and there is no potential across electroluminescent layer 62 (capacitor $C_4$ in FIG. 5). When a middle-IR image is projected on membrane 18, the electron fluxes hitting collector layers 64, 66 differ, and a potential equal to the difference in electron flux times the resistance of resistor $R_4$ appears across electroluminescent layer 62, and causes a visible image to be displayed.

OTHER EMBODIMENTS

Other embodiments of the invention are within the scope of the following claims.

For example, other membrane and cathode materials can be used (e.g., depending on the operating temperatures and the radiation being monitored), and different means can be used to extract from the electron flux the signals related to the middle-infrared images. the Cs-O-Ag cathode material described above has useful thermionic emission near 300° K. Ba O/SrO or Ni has useful emissions in the 400°-700° K. range, and Ba-W has useful emission in the 375° to 500° K. range. Other candidates for low work function cathode material are those listed in Table 4.1 of Bleaney et al., *Electricity and Magnetism*, (Oxford at the Clarendon Press, 1965) p. 92.

Different materials and components can be used to obtain the equivalent circuits shown in FIGS. 3 and 5, and these circuits can be modified to rely on the same principles for extracting image signals. Also, in the image extraction stage a visible image can be provided by light emitting diodes, liquid crystals or plasma-cell panels (e.g., as described in G. F. Weston and R. Bittleston, *Alphanumeric Displays* (McGraw Hill, 1982)) could be used in place of the electroluminescent materials. The brightness display provided by any of these means could be increased by a second stage or even second and third stages of image intensification, as is common in some existing night vision instruments. Another alternative is having the electron flux emerging from the microchannel plate directly strike a phosphor screen, and extracting the infrared image from the resultant visible display by known optical image-processing techniques.

What is claimed is:

1. A middle-infrared image intensifier comprising an image-forming microchannel plate, a thermionic emissive membrane in front of said microchannel plate, said membrane emitting electrons when exposed to middle-infrared radiation, and a lens system to form a middle-infrared image on said membrane, said membrane being sufficiently thin and mounted to have two dimensional temperature differences develop across its surface conforming to said middle-infrared image so that electrons emitted from said membrane are emitted in an amount related to the temperature of the membrane at the position from which they are emitted and are multiplied in channels of said microchannel plate.

2. The intensifier of claim 1, further comprising visible image means for providing a visible image of said middle-infrared image based upon electron flux provided by said microchannel plate.

3. The intensifier of claim 2 further comprising a modulator to repetively admit middle-infrared radiation to said membrane and block middle-infrared radiation from said membrane, and image extraction means for obtaining signals related in magnitude to the difference of the electron flux when no middle-infrared image appears on said membrane and the electron flux when a middle-infrared image appears on said membrane.

4. The intensifier of claim 3 wherein said visible image means and said image extraction means are provided by a plurality of discrete units supported by a glass plate, each said unit including a visible light generating element.

5. The intensifier of claim 4 wherein the electron flux has a varying component of a nonvarying component, and each said unit includes a resistor-capacitor network so that the varying component of the electron flux from said microchannel plate appears at said visible light generating element and the nonvarying component passes through other electrical components in said unit.

6. The intensifier of claim 4 wherein each said unit includes two collectors to receive said electron flux, and means are provided for alternately directing said electron flux to one collector and then the other collector in synchronization with the admitting and rejecting of said middle-infrared radiation by said modulator.

7. The intensifier of claim 6 wherein each said unit includes means for providing to said visible light generating element signals related to the difference in magnitude of the electron fluxes received by said collectors.

8. The intensifier of claim 7 wherein electrodes of said visible light generating element are directly connected to, or integral with, said two collectors, which are each connected to a common resistor.

9. The intensifier of claim 4, 5, 6, 7, or 8 in which said visible light generating element is an electroluminescent element.

10. The intensifier of claim 5 or 8 in which said visible light generating element is made of a member of the zinc sulfide family or electroluminescent materials.

11. The intensifier of claim 4, 5 or 7 in which said visible light generating element is one of the group of a light emitting diode, a liquid crystal element and a plasma panel element.

12. The intensifier of claim 1 or 4 in which said membrane includes a cathode of material of one of the group of Cs-O-Ag, BaO/SiO/-Ni, and Ba-W.

* * * * *